United States Patent
Bishop

(10) Patent No.: US 7,126,417 B2
(45) Date of Patent: Oct. 24, 2006

(54) DISTRIBUTED GAIN NETWORK

(75) Inventor: Donald M. Bishop, Highlands Ranch, CO (US)

(73) Assignee: Mediacell Licensing Corp., Centennial, CO (US)

( * ) Notice: Subject to any disclaimer, the term of this patent is extended or adjusted under 35 U.S.C. 154(b) by 0 days.

(21) Appl. No.: 10/835,944

(22) Filed: Apr. 29, 2004

(65) Prior Publication Data

US 2004/0261121 A1 Dec. 23, 2004

Related U.S. Application Data

(60) Provisional application No. 60/466,810, filed on Apr. 29, 2003.

(51) Int. Cl.
   *H03F 3/68* (2006.01)
(52) U.S. Cl. .............................. 330/51; 330/53; 330/84; 330/124 D; 330/124 R; 330/295; 330/297; 725/127; 725/129; 370/216; 379/413
(58) Field of Classification Search ................ 725/127, 725/129; 370/216; 379/413; 330/51, 53, 330/84, 124 D, 124 R, 295, 297
   See application file for complete search history.

(56) References Cited

U.S. PATENT DOCUMENTS

| 4,565,972 A * | 1/1986 | Kaegebein .............. 330/124 D |
| 2002/0108123 A1 * | 8/2002 | Colak et al. ................. 725/123 |

OTHER PUBLICATIONS

Ciciora, Walter S., PhD., Cable Television in the United States, 1995, Cable Television Labs, Inc., Louisville, CO, USA.

* cited by examiner

*Primary Examiner*—Michael B. Shingleton
(74) *Attorney, Agent, or Firm*—Krajec Patent Offices, LLC; Russell S. Krajec

(57) ABSTRACT

A system and method for a distribution network is provided wherein cascaded power amplifiers with bypass switching are disposed along the branches of the network. The amplifiers may have an RF modem and a programmable digital computer that enables communication with a headend or a controlling computer as well as a bypass switch control for disabling the amplification function of the amplifiers. The amplifier may have a wireless communication system for communicating with individual subscriber's homes and communicating with a neighboring amplifier system for use in emergency situations or during installation and configuration of the network. The network comprised of the amplifiers may have redundant signal paths, using the wireless communication devices of the amplifiers, which may be used as backup signal paths for certain communications requiring high uptime such as telephony.

16 Claims, 8 Drawing Sheets

DISTRIBUTED GAIN NETWORK

CROSS REFERENCE TO RELATED CASES

The present patent application is based upon and claims the benefit of U.S. Provisional Patent Application Ser. No. 60/466,810, filed on Apr. 29, 2003, entitled "Distributed Gain Network" by Donald M. Bishop, which is hereby specifically incorporated herein by reference for all that it discloses and teaches.

BACKGROUND OF THE INVENTION

1. Field of the Invention

The present invention pertains to distribution networks and specifically to substantially linear broadband networks such as cable telecommunications networks.

2. Description of the Background

Amplifiers are typically cascaded along the coaxial portion of a hybrid fiber coaxial (HFC) cable telecommunications distribution networks. The amplifiers are typically spaced as far apart as possible. As the bandwidth needs of the network increase, the demands on the amplifiers also increase. The trend to place amplifiers as far apart as possible has the advantage that fewer devices may be needed for a specific branch of coaxial cable. However, the amplification of each stage requires complex devices that commonly consume a large amount of power. These amplifiers require large amounts of power because the signal must be amplified sufficiently to traverse the larger distances. Layout and installation of conventional networks is complex and cumbersome. A typical field configurable amplifier may require a plug-in equalizer and a plug-in attenuator that must be configured by a technician during installation. This may require expensive analytical equipment to be brought into the field to determine appropriate equalizer or attenuator settings for each amplifier.

Cable telecommunications distribution networks are competing for two-way communication delivery in areas such as telephony and Internet access. One of the weaknesses of the typical cable telecommunications network is the vulnerability to failure. If a failure were to occur in the network, either by having a cable cut or by failure of one of the amplifiers, significant outages may occur. If a cable is damaged in a conventional network, there are no alternate routes by which signals may bypass the damage, leaving all of the downstream subscribers without service until a repair may be instituted. Similarly, if a single amplifier should fail, the large spacing between the amplifiers may prohibit a signal from reaching the next cascaded amplifier with sufficient signal, thereby resulting in similar downstream signal loss. For a cable telecommunications distribution network to effectively compete for telephony applications, the network must have the equivalent reliability of a conventional landline telephony network. The need for subscribers to make emergency calls under any circumstance dictates that the communications network be as failsafe as possible.

It would therefore be advantageous to have the ability to provide a system and method for a distribution network with increased reliability. It would also be advantageous to have a distribution network that minimizes installation and maintenance costs, consumes less power, and is able to carry greater bandwidth.

SUMMARY OF THE INVENTION

The present invention overcomes the disadvantages and limitations of the prior art by providing a system and method for a distribution network wherein cascaded power amplifiers with bypass switching are disposed along the branches of the network. The gain of these amplifier stations are significantly reduced from the present implementations, and thus placed with greater frequency throughout the network to distribute the network's gain much more evenly. The amplifiers may have an RF modem and a programmable digital computer that enables communication with a headend or a controlling computer and may have a bypass switch control for disabling the amplification function of the amplifiers.

The amplifier may also have a wireless communication system for communicating with individual subscriber's homes. The wireless communication system may also be capable of communicating with a neighboring amplifier system for use in emergency situations or during installation and configuration of the network. These amplifiers may be spaced at regular intervals such that the amplification requirements do not require configuring each amplifier with plug-in equalizers or attenuators. Each amplifier may have variable equalizers and variable attenuators that may be varied by the amplifier's digital computer during set up and configuration of the network.

The amplifiers may have a battery back up system for use when the normal power supply to the amplifier may be disturbed. The battery back up system may allow the amplifier to operate fully or with reduced functionality for a period of time as necessitated by the specific embodiment. The described amplifier may also have an auto-location feature for detecting its geographic position in space. Such a feature may include a GPS receiver, or it may use dead reckoning or triangulation to determine its geographic position. The position information may be useful when communicating fault conditions or for monitoring system performance.

The network comprised of the amplifiers may have redundant signal paths by using the wireless communication devices of the amplifiers. The redundant signal paths may be used as backup signal paths for certain communications, such as telephony or other wireless communications that may require high uptime.

The present invention may therefore comprise an amplifier for a distributed gain cable telecommunications network comprising: an input line; an output line; an amplifier circuit; a bypass circuit; a first switch located between the input line and the amplifier circuit and capable of switching between the input line to the amplifier circuit and the bypass circuit; a second switch located between the output line and the amplifier circuit and capable of switching between the output line to the amplifier circuit and the bypass circuit; and a bypass circuit controller capable of switching the first switch and the second switch and thereby removing the amplifier circuit from the network when power is disabled to the bypass controller circuit.

The present invention may further comprise a subscriber tap for a distributed gain cable telecommunications network comprising: an input line; an output line; a power tap connected to the input line and capable of drawing power from the input line; a battery power source; and a power supply connected to the power tap and capable of detecting if the power drawn from the input line is sufficient to power the subscriber tap, the power supply connected to the battery power source and capable of drawing power from the battery power source when the power supply detects that the power drawn from the input line is insufficient to power the subscriber tap.

The present invention may further comprise a method of healing an outage on a cable telecommunications network comprising: coupling a first subscriber tap to the network, the first subscriber tap having a first wireless transceiver and a controller; coupling a second subscriber tap to the network, the second subscriber tap having a second wireless transceiver and a controller, the second subscriber tap being downstream from the first subscriber tap and capable of communicating to the first subscriber tap using the wireless transceivers; transmitting downstream signals along the network; detecting a problem with the downstream signals by the second subscriber tap; establishing communications between the first subscriber tap and the second subscriber tap using the first wireless transceiver and the second wireless transceiver; transmitting an error transmission from the second subscriber tap to the first subscriber tap; and transmitting at least a portion of the downstream signals from the first subscriber tap to the second subscriber tap using the first wireless transceiver and the second wireless transceiver.

The present invention may further comprise a method for healing an outage on a cable telecommunications network comprising: coupling a first amplifier to the network; coupling a second amplifier to the network downstream from the first amplifier in series with the first amplifier, the second amplifier having an input line, an output line, an amplifier circuit, a bypass circuit, a first switch located between the input line and the amplifier circuit and capable of switching the input line between the amplifier circuit and the bypass circuit, a second switch located between the output line and the amplifier circuit and capable of switching the output line between the amplifier circuit and the bypass circuit, and a bypass circuit controller capable of switching the first switch and the second switch and thereby removing the amplifier circuit from the network when power is disabled to the bypass controller circuit; coupling a third amplifier to the network downstream from the second amplifier in series with the first amplifier and the second amplifier; transmitting a signal downstream through the network; detecting a problem with the second amplifier; causing the bypass circuit controller of the second amplifier to switch the first switch and the second switch and thereby removing the second amplifier from the network; amplifying the signal with the first amplifier to produce a first amplified signal; transmitting the first amplified signal downstream; bypassing the second amplifier; receiving the first amplified signal with the third amplifier; and amplifying the first amplified signal with the third amplifier to produce a second amplified signal.

One of the advantages of the present invention is that lower power amplification is required than previous networks due to the spacing and low introduction of noise to the system. The lower power enables simpler amplifier devices that consume much less power and therefore affordable battery backup may enable the device to operate when power is lost. Further, a wireless communication capability may allow neighboring devices to transmit all or a portion of the communication traffic from one device to another (heal) in the event of a cable cut or failure. The amplifiers may be connected and installed without performing complex analysis of each amplifier installation, significantly reducing the training and educational requirements of installation technicians.

DETAILED DESCRIPTION OF THE INVENTION

Figure 1:
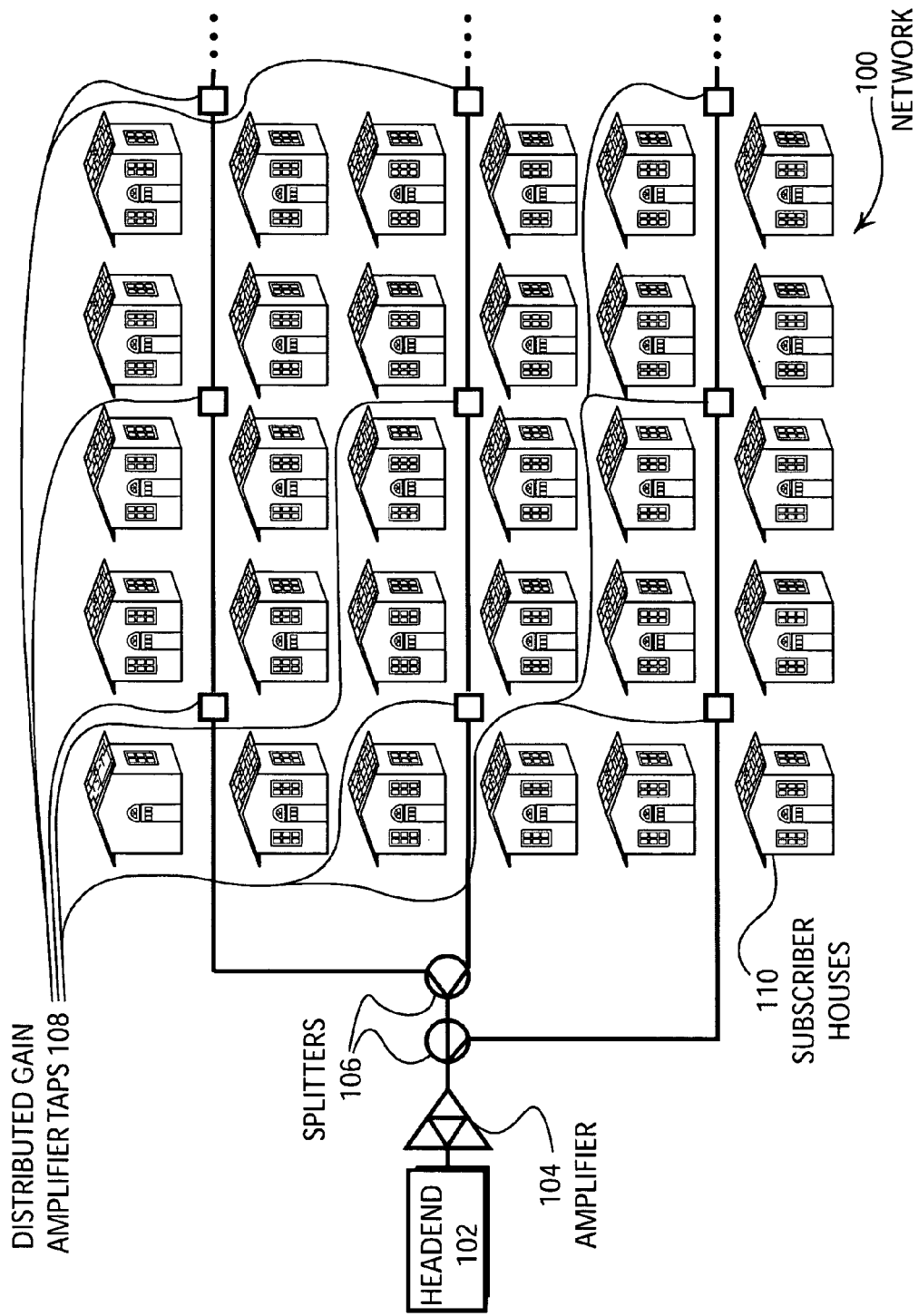
FIG. 1 is an illustration of an embodiment of the present invention of a distribution network.

FIG. 1 illustrates an embodiment 100 of the present invention of a distribution network 100. Cable and Digital Subscriber Lines (DSL) require "substantially linear" networks to carry highly complex modulation formats that mix amplitude, phase and frequency modulation (AM, PM and FM), which are also multi-carrier with high signal spectral densities. Systems for communicating information from a client device to a substantially linear broadband network have been contemplated in U.S. Pat. No. 6,377,782 issued to Bishop et al., which is hereby incorporated by reference for all it teaches and discloses. Cable telecommunication networks are made of long spans of coaxial and fiber cables, which are inherently subject to high signal loss. To replace lost signal amplitude (and maintain minimum signal-to-noise ratios) amplifiers are necessary. A purely linear amplifier, that is an amplifier with no non-linear terms in its gain equation, will simply increase the amplitude of all signals evenly across the entire spectrum. A non-linear amplifier, or one that has non-linear terms in its gain equation, will heterodyne signals, which produces interfering signals that did not exist as such prior to heterodyning. Also, such a non-linear amplifier will also add gain unevenly across the band, which adversely affects the signal to noise ratio (S/N) of some signals. Gain compression, incidental phase modulation, and other effects each destroy the integrity of the amplified signals as a result of the non-linear elements in the gain. In the DSL system, a multiplicity of signals are added to a network, such that the signals are bi-directional and are separated in frequency, i.e., Frequency Division Multiplexed (FDM). These FDM signals propagate in opposing directions, according to the spectral assignment. These signals may also include complex-modulation signals such as Time Division Multiplexed information that require a high degree of network linearity.

As shown in the substantially linear distribution network of FIG. 1, a headend 102 is a central point wherein downstream signals originate and where upstream signals are collected. An amplifier 104 and splitters 106 distribute the signals to various branches of the network. Distributed gain amplifier taps 108 are placed at spaced distances from each other along the various branches of the network. Various methods may be employed to direct signals into and out from the subscriber houses 110. The distributed gain amplifier taps 108 may both amplify the signals and provide distribution of the signals to the subscriber houses 110. In some cases where no subscriber homes 110 are nearby, the distributed gain amplifier taps 108 may be used only as cascaded amplifiers.

In some embodiments, the amplifiers 108 may be on the order of 10 dB or less amplification. The relatively low amplification of the amplifiers 108 may result in a much less costly amplifier than a 20 or 30 dB amplifier that is commonly used in the art. Such high gain amplifiers, that are commonly used in the art, typically have high power consumption, require large heat sinks, and are very complex due to the high gain that needs to be applied to a very large signal spectrum in a linear manner.

The distributed gain amplifier taps 108 may be spaced such that a signal can bypass a failed local amplifier and be received by the next amplifier in the cascade. Such a feature may allow signals to traverse a failed amplifier and still allow downstream service to continue. In such an embodiment, a single amplifier failure will not have the effect of severing service to all of the downstream subscribers.

Figure 2A:
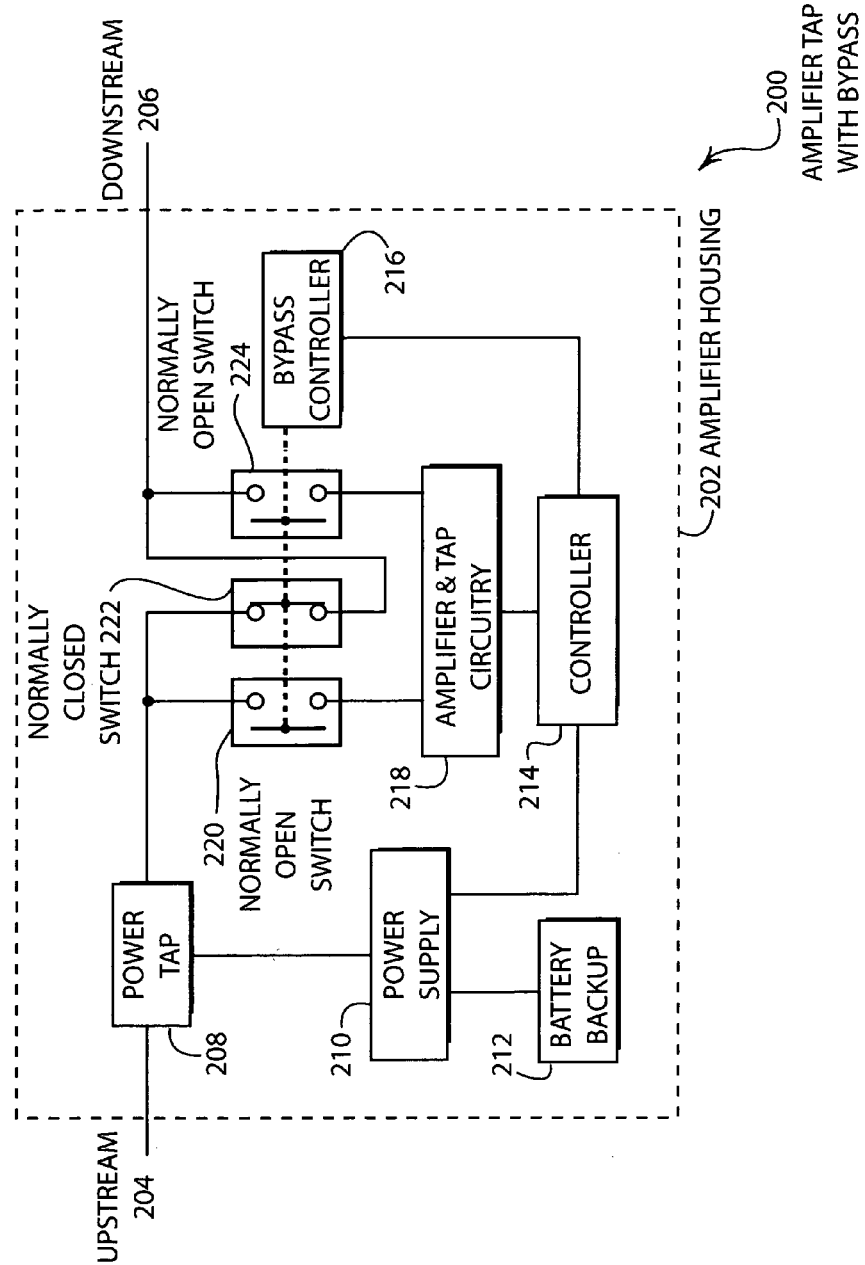
FIG. 2A is an illustration of an embodiment of the present invention of an amplifier with a bypass mode.

FIG. 2A illustrates an embodiment 200 of the present invention of an amplifier with a bypass mode. The amplifier housing 202 has an upstream input 204 and a downstream output 206. In many cases, bidirectional signals may be carried on both the upstream connection 204 and the downstream connection 206. A power tap 208 normally takes low frequency AC power off of the cable and transfers the power to a power supply 210 connected to a battery backup 212. A controller 214 connects to a bypass controller 216 to the amplifier tap and circuitry 218. The upstream signal is connected to a normally open switch 220, a normally closed switch 222, and a second normally open switch 224. The bypass controller 216 is operable to actuate the three switches 220, 222, and 224 in unison.

Figure 2B:
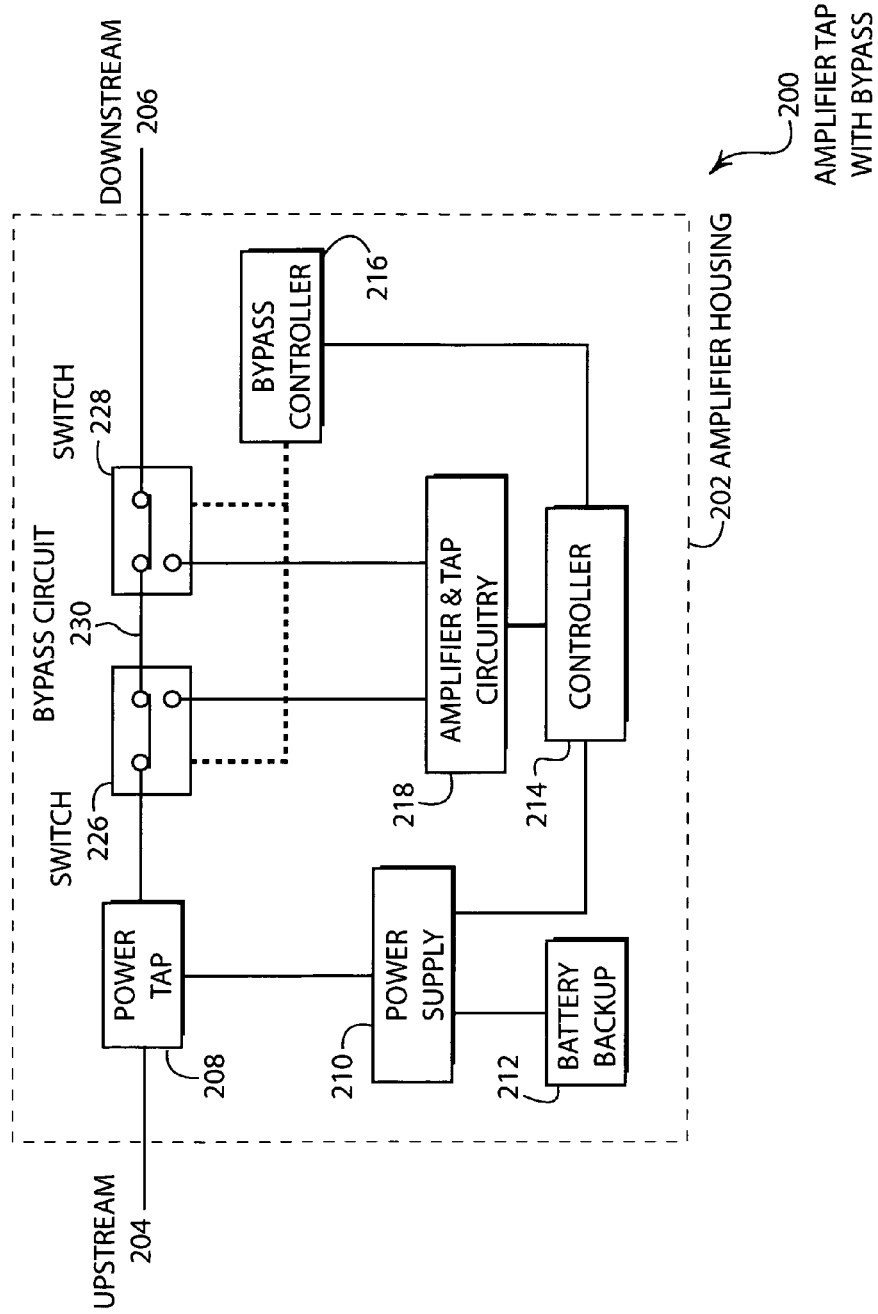
FIG. 2B is an illustration of a second embodiment of the present invention of an amplifier with a bypass mode.

FIG. 2B illustrates an embodiment 201 of the present invention of an amplifier with a bypass mode. The amplifier housing 202 has an upstream input 204 and a downstream output 206. In many cases, bidirectional signals may be carried on both the upstream connection 204 and the downstream connection 206. A power tap 208 normally takes low frequency AC power off of the cable and transfers the power to a power supply 210 connected to a battery backup 212. A controller 214 connects to a bypass controller 216 to the amplifier tap and circuitry 218. The upstream signal is connected to the switch 226, and a second switch 228. The switches 226 and 228 are capable of switching between the amplifier and tap circuitry 218 and the bypass circuit 230.

The embodiment 200 is an amplifier that is adapted to allow signals to bypass the amplifier and tap circuitry 218 when no power is applied to the amplifier, i.e., when the switches 220, 222 and 224 revert to their respective normal states described above or when the controller 214 dictates. Therefore, the normally open switches 220 and 224 and normally closed switch 222 are configured in the circuit to bypass the amplifier and tap circuitry 218 when no power is available on the cable 204 or when the battery backup 212 is completely discharged. When power is available, bypass controller 216 operates the switches 220, 222 and 224 to route the signals on the upstream 204 and downstream 206 cables through the amplifier and tap circuitry 218.

The amplifier and tap circuitry 218 may contain the amplification circuitry necessary to boost the signal strength to traverse the cable to the neighboring amplifier. In some embodiments, the signal strength of the incoming signal may be sufficient to traverse the length of the outgoing cable and be adequately received by the next amplifier in cascade without being amplified by the amplifier and tap circuitry 218, such as when the amplifier and tap circuitry 218 is bypassed by the operation of switches 220, 222 and 224 as described above.

The amplifier and tap circuitry 218 may also contain the circuitry to connect to various subscriber homes (such as subscriber houses 110[]shown in FIG. 1). The tap circuitry relates to various mechanisms by which the subscriber may receive downstream signals and transmit upstream signals. These mechanisms can include direct-wired drops from the amplifier housing 202 to each subscriber home. In a typical application, from one to sixteen or even more subscribers (homes or other units) may be connected to an amplifier housing 202. In some cases, multiple drops to a single house may be used. In other embodiments, a wireless connection may be present from the amplifier housing 202 to the subscriber homes. In still other embodiments, a combination of wireless and wired drops may be used.

FIG. 2B is an illustration of a second embodiment of the present invention of an amplifier with a bypass mode.

The battery backup 212 may be a small battery capable of powering the controller 214 and amplifier and tap circuitry 218 for an extended period of time. In a typical HFC cable telecommunications distribution network, power supplies may be attached to the network to supply power to the various components to the network such as the amplifiers. Should one or more of these power supplies fail, the battery backup 212 may be capable of supplying sufficient power to the amplifier 202 to keep the service intact.

In some embodiments, the controller 214 may be able to detect that the power tap 208 is unable to supply sufficient power to operate all of the circuitry of the amplifier 202. The controller 214 may be able to switch to a power saving mode when the battery backup 212 supplies the power. A power saving mode may include operating with reduced functionality, such as a reduction in amplification of the incoming signals or amplifying only a selected band of frequencies. In some embodiments, the controller 214 may detect a change in output from the power tap 208 and the controller 214 may then send an upstream communication that indicates a problem with the amplifier. Such a communication may include the amplifier identification or location information as well as an error code or alert.

The battery backup 212 may be a rechargeable battery system that is capable of being recharged by the power supplied by the power tap 208. The power supply 210 may be capable of detecting the status, charge capacity, abnormalities, or other criteria relating to the battery backup 212 and communicating such information to the controller 214. The controller 214 may further be capable of transmitting such information to a headend either periodically or when requested by the headend. In some embodiments, indicator lights or other external indicators may be present on the amplifier housing 202 to visually indicate the status of the battery backup 212.

The controller 214 may be capable of activating the bypass controller 216 to bypass the amplifier and tap circuitry 218 on command. For example, there may be situations such as troubleshooting, testing, or calibration of the network when it is desired to operate the switches 220, 222 and 224 to operate amplifier 202 in bypass mode. In other embodiments, the bypass controller 216 may be hardwired to switch into bypass mode only when there is no power available to operate the switches 220, 222, and 224.

Figure 3:
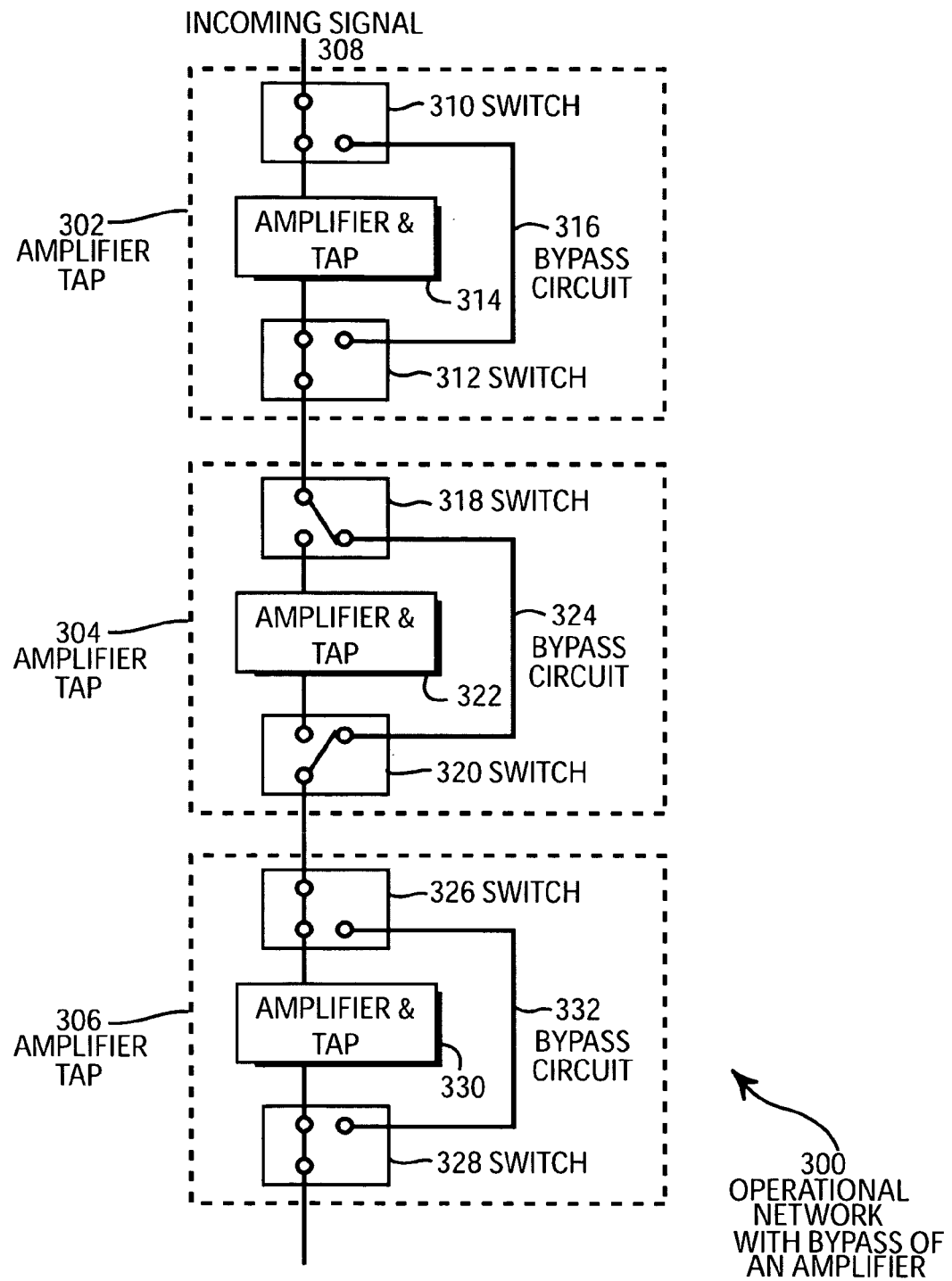
FIG. 3 is an illustration of an embodiment of an operational network with the bypass of an amplifier.

FIG. 3 illustrates an embodiment of an operational network with the bypass of an amplifier. The amplifiers 302, 304, and 306 are connected in cascade. In normal operation, the incoming signal 308 enters the amplifier 302 and passes through switch 310, amplifier and tap circuitry 314, and out through switch 312. A bypass circuit 316 is switched out of the circuit, during such normal operation, so the signal then enters amplifier tap 304. In normal operation, the signal in the amplifier tap 304 would pass through, and be amplified by, the amplifier and tap circuitry 322. However, the switches 318, 320 are illustrated in FIG. 3 as being open, as would occur, for example, if there is a power failure the amplifier tap 304 or if the amplifier and tap 318 is otherwise inoperable, to route the signal through the bypass circuit 324. In this bypass mode, the signal is switched by switch 318 onto the bypass circuit 324 and again switched by switch 320 out of the amplifier 304 to bypass the amplifier and tap circuitry 322, which is switched out of the circuit. The signal then enters amplifier tap 306, which is illustrated in FIG. 3 in the normal operating mode wherein the signal is switched by switch 326 to the amplifier and tap circuitry 330 and again it is routed by switch 328 out of the amplifier 306. The bypass circuit 332 is shown in FIG. 3 as being switched out of the circuit, e.g., amplifier tap 306.

The embodiment 300 illustrates how the downstream portion of a distribution system may be at least partially operational when a problem exists with one, e.g., amplifier 304, of a series of cascaded amplifiers 302, 304, 306. The amplification of amplifier 302 may be sufficient to bridge the distance between amplifier 302 and amplifier 306 without the amplification required by amplifier 304. In such an embodiment, the spacing between the amplifiers 302, 304, and 306 may be less than the maximum possible distance that an amplifier could cause a signal to traverse. For example, if the amplifiers 302, 304, and 306 were spaced at about half the maximum possible distance each amplifier is capable of traversing, a signal may traverse the distance between the amplifier 302 directly to amplifier 306, while skipping amplifier 304, and still be able to provide effective communications to downstream amplifiers or nodes.

In some embodiments, the amplifiers 302, 304 and 306 may be tunable and communicative to adapt to an outage by on of these components, such as an outage of amplifier 304 described above. For example, when amplifier 304 is caused to go off line and pass signals through the bypass circuit 324, the amplifier 306 may detect that the power of the signal has degraded, whereupon the amplifier 306 may be capable of sending a communication to amplifier 302 to increase the amplification gain to compensate for at least some of the losses of the gain normally provided by amplifier 304. Amplifier 306 may also be capable of increasing the gain of its amplification of the incoming signals and thus restoring the downstream power level from amplifier 306 to the normal level.

In another example, when the amplifier 304 enters the bypass mode, as described above, the amplifier 302 may be capable of detecting a loss or drop of upstream signals, whereupon amplifier 302 may increase the gain of its amplification until communication is established with amplifier 306. When communication is established between amplifier 302 and amplifier 306, each amplifier may adjust the gain of the respective upstream and downstream signals until the signal gain is restored to an acceptable level.

When amplifier 304 enters bypass mode, amplifier 304 may also be capable of detecting that bypass mode is beginning and may be capable of indicating that status to upstream amplifier 302 and/or downstream amplifier 306. Amplifier 304 may be further capable of indicating bypass status to the headend and thus to a service technician that service is needed.

In some situations, amplifier 304 may enter bypass mode without prior warning. In such cases, amplifiers 302 or 306 may be capable of detecting a problem with amplifier 304 and sending a message to the headend to that effect. In some embodiments, the message may indicate only that a fault has occurred. In other embodiments, the message may indicate the location of the outage, the magnitude of adjustments necessary to overcome the outage, whether amplifiers 302 and 306 were able to restore communication between themselves, or other status items as would be needed or desired.

In some embodiments, when amplifier 304 enters bypass mode, the amplifiers 302 and/or 306 may enter a reduced service mode, wherein only certain channels may be open for communication. For example, such a reduced service mode may comprise transmitting telephony or data communication, while eliminating cable telecommunications transmissions. Other tradeoffs between bandwidth, service, power consumption, and other factors may be contemplated for determining a reduced service mode. Such a mode may allow critical services, such as emergency telephone calls, to be placed.

Figure 4:
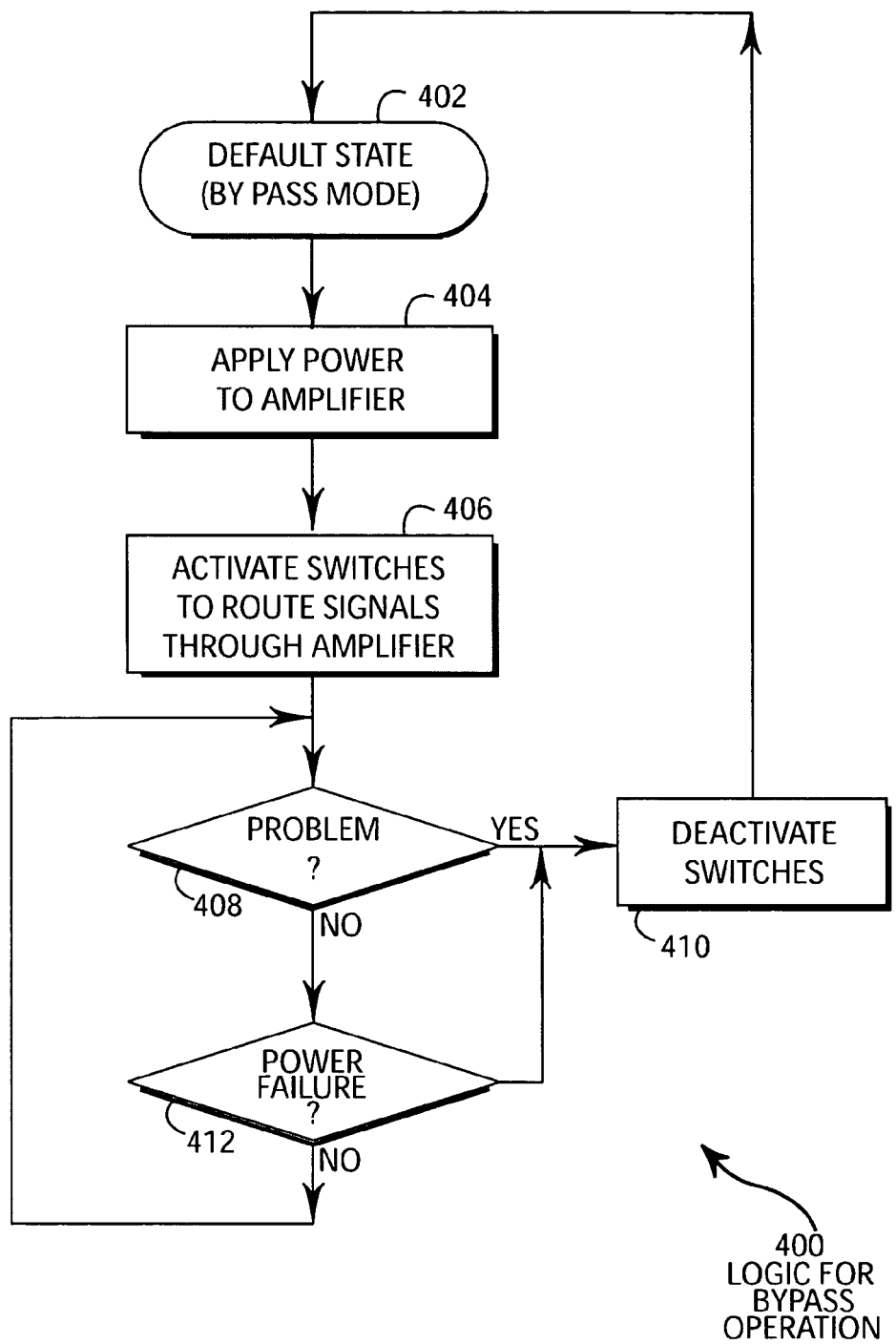
FIG. 4 is a work flow diagram of an embodiment of the present invention of the logic for entering bypass mode for an amplifier.

FIG. 4 illustrates an embodiment 400 of the present invention of the logic for entering bypass mode for an amplifier. The amplifier begins in the default state of bypass mode in block 402. Power is applied to the amplifier in block 404. Switches are activated to route signals through the amplifier circuit in block 406. If a problem is detected in block 408, the switches are deactivated in block 410 and the device returns to bypass mode in block 402. If there is a power failure in block 412, the switches may be deactivated in block 410 and bypass mode is entered in block 402.

The default state of the device may be in bypass mode in block 402. The device may require power to activate the bypass mode switches and thus when a power failure occurs in block 412, the amplifier may be changed to bypass mode and allow other amplifiers or devices to communicate across the network. In such a manner, a problem with the device may not cause other outages or disruptions of service.

The detection of a problem in block 408 may be by a controller or other logic device that detects a set of conditions that indicate that bypass mode is desired. For example, if insufficient power is supplied to the amplifier or a problem exists with a battery backup system when the battery backup system is the sole power supply, the controller may indicate that a problem exists in block 408. In another example, a controller may receive a command transmitted downstream or upstream to enter bypass mode. In such a case, a downstream amplifier may indicate a problem with the signals being amplified by the amplifier and request that the amplifier be brought off line. In another example, a technician may transmit a request along the signal path to disable a specific amplifier for calibration, testing, or installation of other components or devices to the network.

Figure 5:
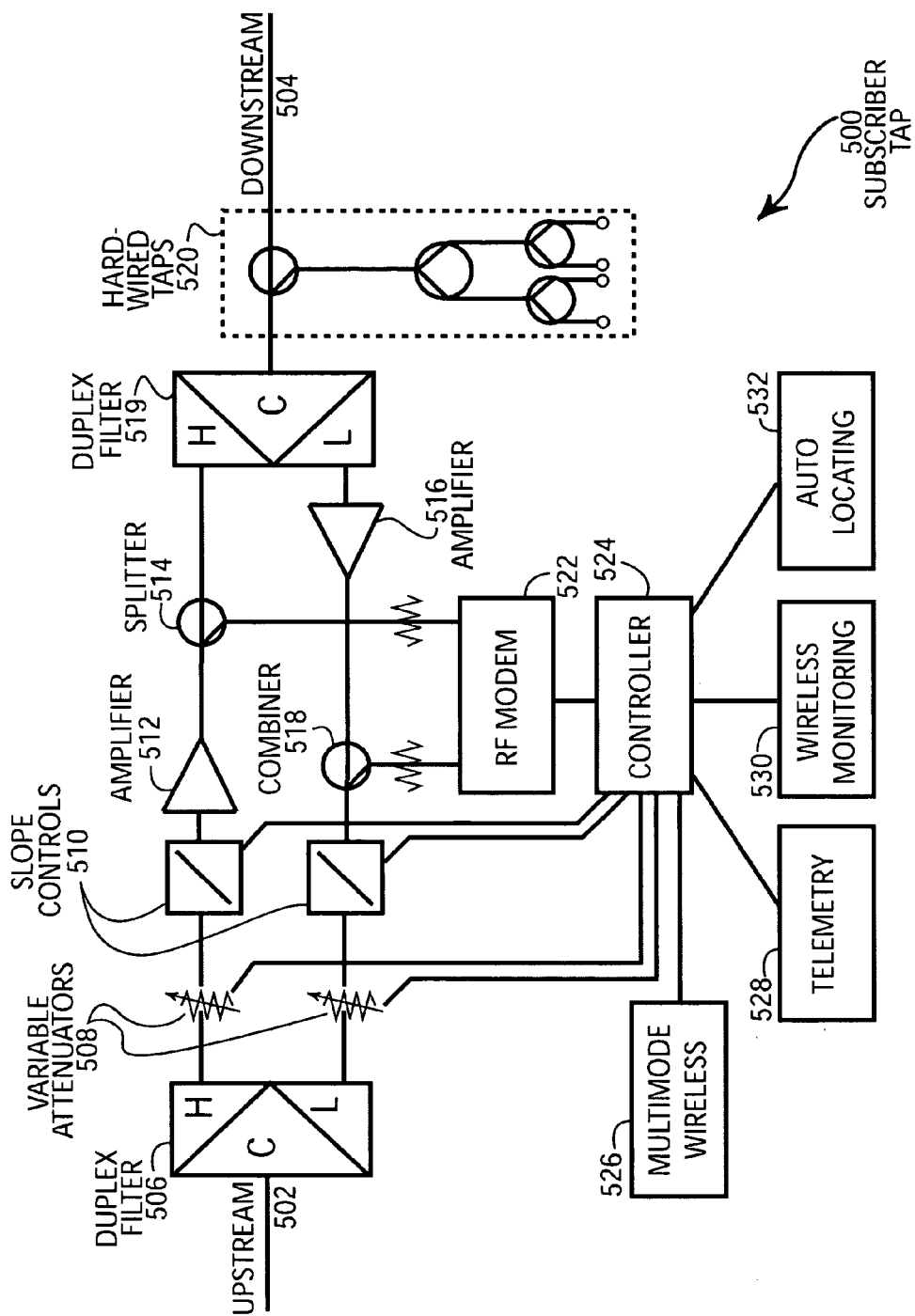
FIG. 5 is an illustration of an embodiment of a subscriber tap that includes amplifiers and tap circuitry.

FIG. 5 illustrates an embodiment 500 of a subscriber tap that includes amplifiers 512 and 516 and tap circuitry 520. The upstream cable 502 and downstream cable 504 are illustrated. The upstream cable 502 is connected to a diplex filter 506 that splits the signals into a high frequency downstream signal and a low frequency upstream signal. The signals pass through variable attenuators 508 and variable slope controls 510. The high frequency downstream signal passes through an amplifier 512 and a splitter 514 to a second diplex filter 519. The low frequency upstream signals pass from the diplex filter 519, an amplifier 516 and a combiner 518 before the slope controls 510 and variable attenuators 508. The upstream and downstream signals pass to an RF modem 522 that is connected to a controller 524. The controller 524 may be connected to a multimode wireless system 526, a telemetry system 528, a wireless monitoring system 530, and an auto-locating system 532. The subscriber tap 500 may also include hard-wired subscriber taps 520. The embodiment 500 may be the amplifier and tap circuitry 218 as illustrated in FIG. 2.

The variable attenuators 508 and variable slope controls 510 may be able to tune the high frequency and low frequency signals to specific parameters under command of the controller 524. In some embodiments, the RF modem 522 and controller 524 may be capable of detecting abnormalities in the signals and calibrating the settings of the variable attenuators 508 and slope controls 510. For example, a special calibration signal may be transmitted from a neighboring amplifier to the tap 500 by which the controller 524 may be able to make adjustments to the attenuators 508 and slope controls 510. In other embodiments, a service technician may set the parameters of the attenuators 508 and slope controls 510. In such an embodiment, test equipment or other external equipment may be used to determine the appropriate parameters for the attenuators 508 and slope controls 510.

The auto-locating system 532 may be capable of determining the physical location of the tap 500. For example, a global positioning system (GPS) receiver may be used as a part of the auto-locating system to determine the precise geographic location of the tap 500, to determine attributes such as latitude, longitude, and altitude of the tap 500. In some embodiments, the GPS receiver may be configured to determine the electronic orientation of the tap 500. The orientation of the tap 500 may be useful in mapping a network, as the upstream and downstream directions of the tap 500 may be determined with simple detection circuitry or sensors. In other embodiments, a technician may program the auto-locating system 532 with location information for the tap 500. The auto-location system 532 may be used to provide location information for alert signals or other communications pertinent to the tap 500. Accurate location information may be useful in assisting a technician to immediately locate a tap 500 that needs service or for other uses in diagnosing problems, analyzing the performance of the network, or other uses as those skilled in the arts may devise.

The multimode wireless system 526 may provide wireless communication to subscriber homes in a bidirectional fashion. An antenna (not shown) could be mounted in communication with the subscriber tap 500 to communicate with an antenna mounted on, in, or near a subscriber home (not shown). This antenna may be directional or omnidirectional.

The multimode wireless system 526 may be further capable of communicating with other subscriber taps that also are equipped with a multimode wireless system. Communication to other subscriber taps may be useful for communication when a cable is severed between two taps or for status or other ongoing or sporadic communications.

The telemetry system 528 may be capable of measuring, detecting, and communicating various data about the performance, status, operation, and settings of the tap 500. For example, the telemetry system 528 may be capable of measuring the power levels, distortion, bit error rate, signal to noise ratio, or other parameters of the various incoming signals. Those skilled in the arts may use the telemetry system 528 to measure, record, or detect various other parameters, which is also within the scope and intent of the present invention.

The wireless monitoring system 530 may be capable of communicating with a portable wireless device for service, monitoring, set up, or other functions. A technician may have a handheld or truck mounted wireless communication apparatus that may enable the technician to read, monitor, and adjust various parameters of the tap 500. Such a device may be used from the roadside without requiring the technician to climb up a pole or open a ground-mounted box to physically access the tap 500.

The hard-wired taps 520 may be a series of splitters that enable common wired subscriber drops to be connected to the tap 500. The tap 500 may be capable of several hard-wired drops. In some embodiments, only one hard wired tap may be used while in other embodiments, any number, for example sixteen or thirty-two taps may be present.

Figure 6:
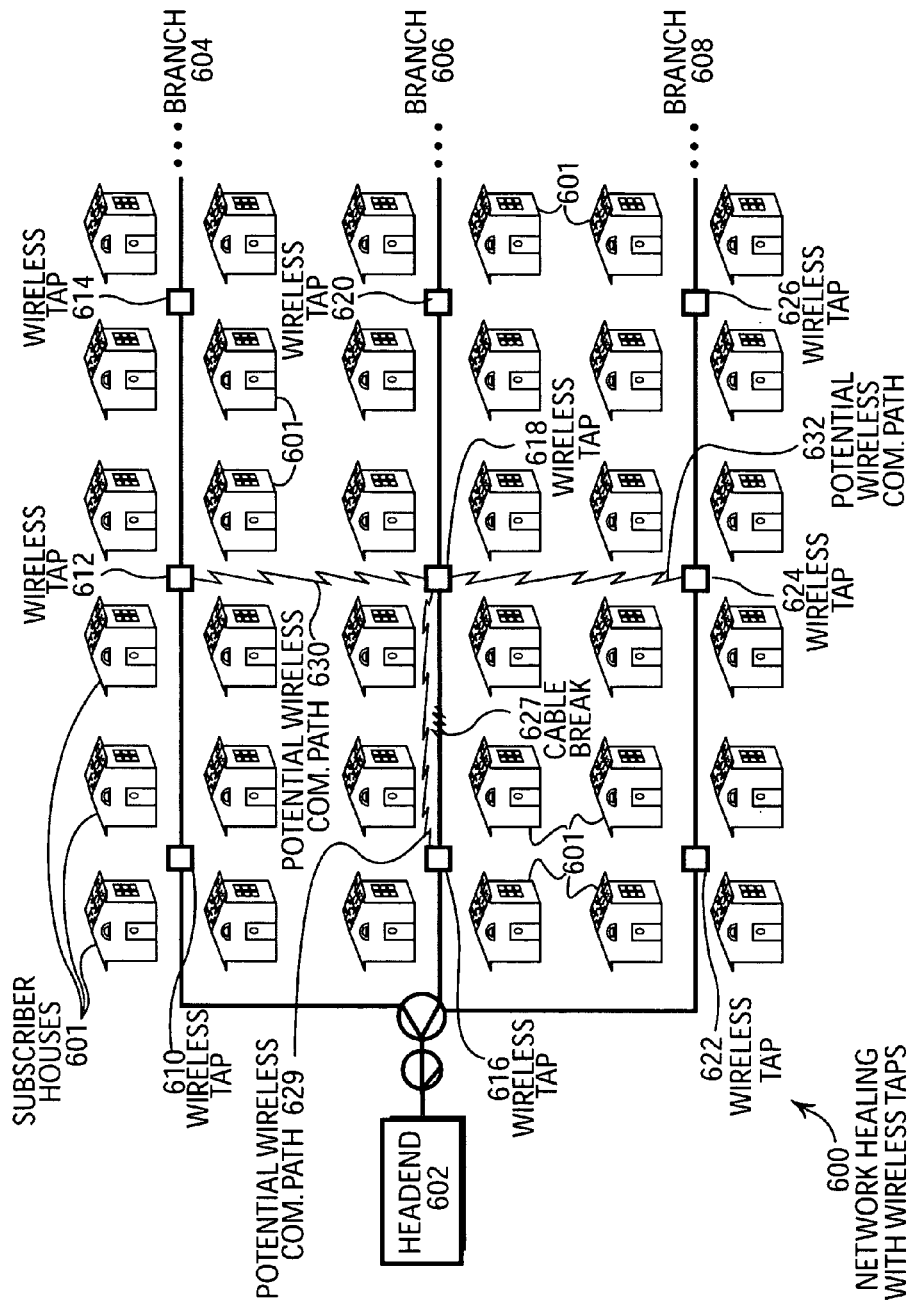
FIG. 6 is an illustration of an embodiment of the present invention of a healing network.

FIG. 6 illustrates an embodiment 600 of the present invention of a healing or compensating network. Cable telecommunications networks (e.g., coaxial based, hybrid fiber/coaxial, hybrid microwave radio/coaxial, etc) have a need to replace cable/fiber/radio path loss with gain. Such gain is provided in bulk at one or more locations or stations along the network path as a signal makes its way from the signal source to its destination. In bi-directional networks, gain is usually added in two directions. This bulk gain has been typically added in increments of 25 dB or more, spaced as far apart as possible, and accumulating as much gain as possible. While conventional systems attempt to increase this spacing, such increase in the gap increases the loss between stations, and thus, increases the amount of gain required at each station. Because this gain is required to preserve minimum S/N of the transmissions carried on this cascaded-amplifier network, a failure of a single gain stage has always meant system outages from the point of failure.

Attempts have been made in the past to allow networks to "self-heal" in the event an amplifier station failed. A common approach was to passively switch around the failed station. As a consequence of the high gains involved, S/N could not be preserved above the minimum, and these passive switching attempts were, and remain, abandoned. Additional solutions have been attempted by adding gain subsystems in parallel (DC bias subsystems, etc.). A key drawback was that these redundant systems added cost and complexity, and primary system failures went unnoticed until the secondary systems that took over also failed. The added complexity reduced the overall reliability of the amplifier stations, and therefore, was not seen as an effective solution. Complicated status monitoring subsystems were also added in an attempt to monitor and report primary subsystem failures, but these too added to cost and complexity and were deemed largely ineffectual.

By distributing gain throughout the network, failed amplifier stations can be passively bypassed, thereby routing signals around the failed station. Because gains are much lower, losses in S/N are much more manageable and the network can easily survive. Bypassing can occur for any subsystem failure, elimination the complexity of subsystem monitoring and internal redundancy. Reporting can be accomplished by a simplistic role-call method rather than sophisticated telemetry. If a station fails to report (or respond to a poll) it is assumed failed and replacement can be scheduled. Since the entire active circuitry can be bypassed without causing transmission errors (due to poor S/N, e.g.) emergency maintenance and service outages are significantly reduced, while simplifying network and amplifier systems, which in turn also act to aid network reliability. Properly designed networks using this Distributed Gain technique can thus survive a complete station failure and survive with transmission in tact.

As shown in FIG. 6, the headend 602 is connected to branches 604, 606, and 608. Along branch 604 are wireless taps 610, 612, and 614. Along branch 606 are wireless taps 616, 618, and 620. Along branch 608 are wireless taps 622, 624, and 626. An example of a cable break 627 is indicated diagrammatically between wireless taps 616 and 618 on branch 606. Using multimode wireless communications, tap 618 has the capability to establish communications with tap 616 using potential communication path 629, with tap 612 using path 630, or with tap 624 using path 632.

The wireless communications paths 629, 630, and 632 between tap 618 and taps 616, 612, and 624, respectively illustrate several paths that may be used to communicate around a failure. The paths 629, 630, and 632 are possible when the various taps are located with enough proximity that communication may exist.

In some embodiments, the communication between a tap in distress, such as tap 618 that cannot receive a downstream signal through the normal cable channel, and another tap may consist of sending a distress signal, which may include the nature of the problem and any location information concerning the tap. In other embodiments, the tap 618 may be capable of establishing and using a constant wireless communication link to a neighboring tap to transmit and receive critical communications. For example, critical communications such as telephony may be kept in operation using wireless communication to an adjacent tap. In still other embodiments, sufficient bandwidth may be present in one of the wireless communication paths 629, 630, and 624 to transmit and receive all of the upstream and downstream communications. In some embodiments, more than one communications path may be operable simultaneously to handle the bandwidth of information.

In some embodiments, the wireless communication path may be restricted to only the adjacent wireless tap on the same branch of the network, such as communications path 629. In other embodiments, a wireless communications path may be established with different branches of the network such as communications paths 630 and 632.

Figure 7:
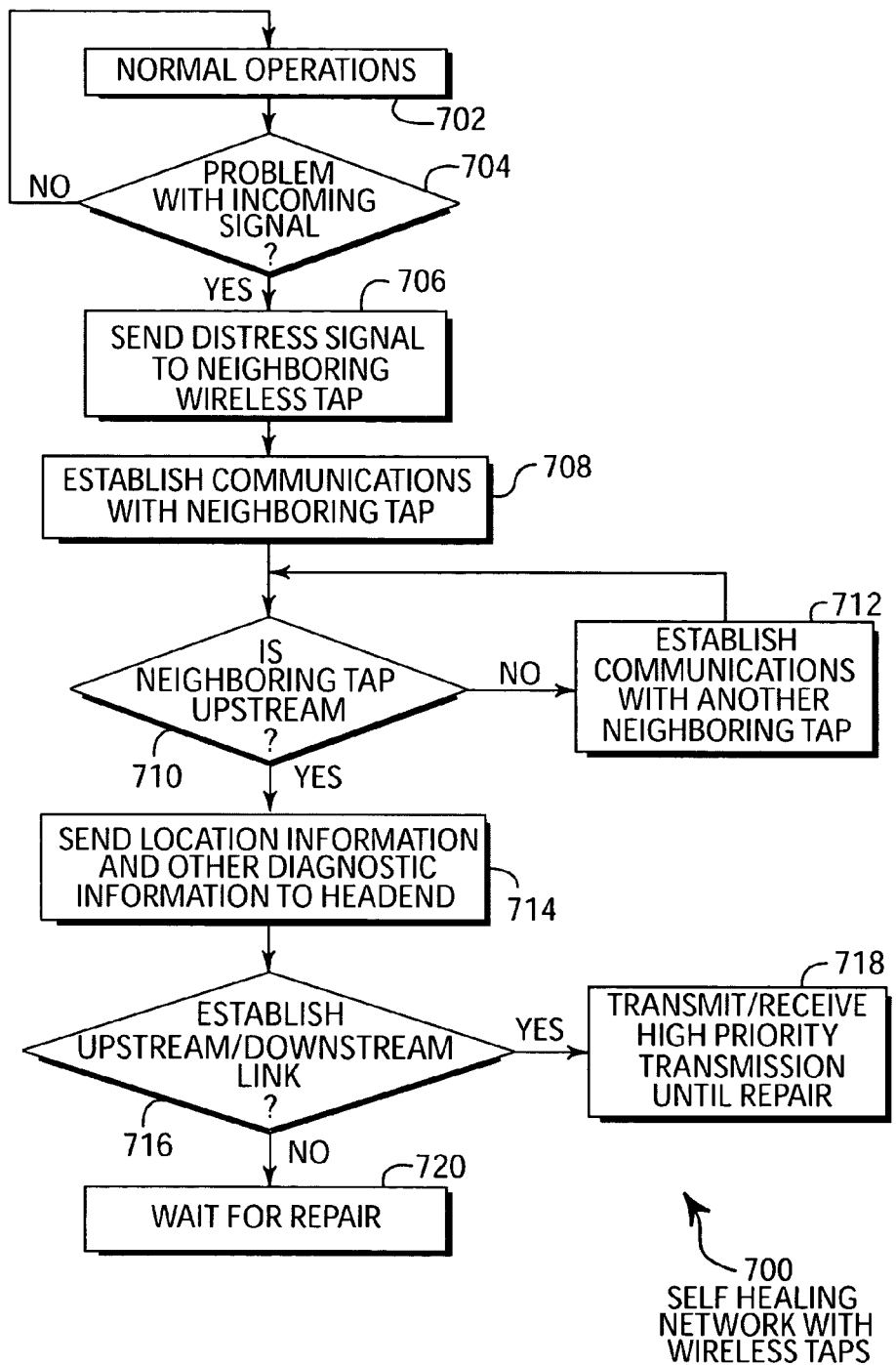
FIG. 7 is a work flow diagram of an embodiment of the present invention of a method for self-healing in a distribution network with wireless communications.

FIG. 7 illustrates an embodiment 700 of the present invention of a method for self-healing in a distribution network with wireless communications. This process begins with normal operations having been established in block 702. When a problem is detected with the incoming signal in block 704, a distress signal may be sent to a neighboring wireless tap in block 706. The distress signal may be used to establish communications with a neighboring tap in block 708. If the neighboring tap is not determined to be upstream in block 710, communications may be established with another neighboring tap in block 712. When communications with an upstream tap is established with an upstream tap in block 710, location information and other diagnostic information may be transmitted to the headend in block 714. If it is determined that an upstream/downstream link may be established in block 716, such a link is established in block 718. If no such link may be established in block 716, the unit waits for a repair in block 720.

The embodiment 700 is one method by which a fault with an incoming signal may be healed using a temporary wireless communications link between wireless enabled devices connected to a wired distribution network such as HFC cable telecommunications distribution networks. When a problem is detected, a wireless communication path is established by which a distress message may be transmitted to a headend so that a technician may be dispatched to repair the failure. The communications path may further be used to link around the failure in the network so that at least some upstream and downstream communications is possible.

The detection of a problem with the incoming signal in block 704 may be through any of various mechanisms. For example, a dedicated circuit may be used to detect the incoming signal or a controller within the tap may be capable of detecting the absence or severe degradation of the incoming signal.

The distress signal of block 706 and subsequent communications established with other wireless taps may take place in any available portion of the RF spectrum. In some cases, the distress signal may be broadcast at the maximum output power of the transmitting device and the establishment of communications with a neighboring tap may occur at a lower power level than the distress signal.

A neighboring tap may receive the distress signal of block 706 and the signal may indicate the physical location of the tap in distress. The neighboring tap that receives such a signal may determine the distance to the tap broadcasting the distress signal and adjust the power level of the wireless communications so that the broadcasts do not interfere with other broadcasts.

The aforementioned embodiments may apply to distributed gain networks that utilize discrete carrier modulation as well as Ultra-Wideband (UWB) Modulation. UWB works by presenting signal energy at certain spectral positions (tones, notes etc.) at a particular time and duration. These tones (notes) in combination, at a particular time can be used to represent data, much like select keys on a piano keyboard played together for a time interval represent different musical "data". Similar to a non-linear audio system distorting a piano's sound, a non-linear communications network distorts the integrity of a UWB digital signal. Also since the UWB signal relies on ultra short bursts of energy (in time domain) network pulse response time is also important. Thus networks that carry UWB signal formatted signals also require, to a high degree, substantially linear network transfer characteristics.

With discrete carrier modulation baseband information is used to modulate an unrelated tone acting as a carrier wave for the baseband information. The resultant waveform is a combination of the original carrier wave and the applied baseband signal to create and can be in the form of AM, FM or PM. If the process also is such that the original carrier wave's energy is eliminated and only the modulation effects are transmitted, it is called a suppressed carrier (transmission). These formats can be used in combination. For example, if two identical carrier waves, offset in phase by 90 degrees are themselves phase modulated, then summed in a summing network, the output waveform will also contain an amplitude component. This format is thus called Quadrature Amplitude Modulation, or QAM.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An amplifier for a distributed gain cable telecommunications network comprising:
   an input line;
   an output line;
   an amplifier circuit;
   a bypass circuit;
   a first switch located between said input line and said amplifier circuit and capable of switching said input line to said amplifier circuit;
   a second switch located between said output line and said amplifier circuit and capable of switching said output line to said amplifier circuit; and
   a bypass circuit controller capable of switching said first switch and said second switch and such that said amplifier circuit is removed from said network, said bypass circuit controller further adapted to send a signal upstream or downstream to change at least one gain level of an upstream or downstream amplifier based on said switching mechanism.

2. The amplifier of claim 1, wherein said amplifier circuit further comprises distribution taps.

3. The amplifier of claim 2, wherein said distribution taps comprise a radio transceiver.

4. The amplifier of claim 2, wherein said distribution taps comprise at least one power splitter.

5. The amplifier of claim 1 further comprising:
   an RF modem and a programmable digital computer that enables communication between said amplifier and a headend or a controlling computer.

6. The amplifier of claim 5 further comprising:
   a variable equalizer and a variable attenuator in communication with said programmable digital computer to vary controls during set up and configuration of said network.

7. The amplifier of claim 1 further comprising:
   a battery back up for use when a primary power supply to said amplifier may be disrupted.

8. The amplifier of claim 1 further comprising:
   an auto-location feature for detecting a position in space of said amplifier.

9. The amplifier of claim 8, wherein said auto-location feature comprises a global positioning system receiver.

10. The amplifier of claim 1, wherein said distributed gain cable telecommunications network modulates signals utilizing Ultra Wide Band Modulation, Discrete Carrier Modulation, Suppressed Carrier Modulation or Quadrature Amplitude Modulation.

11. A cable telecommunications network comprising:
    a cascade of amplifiers with bypass switching disposed along branches of said cable telecommunications network, said amplifiers further comprising;
    an input line;
    an output line;
    an amplifier circuit;
    a bypass circuit;
    a first switch located between said input line and said amplifier circuit and capable of switching said input line to said amplifier circuit;
    a second switch located between said output line and said amplifier circuit and capable of switching said output line to said amplifier circuit; and
    a bypass circuit controller capable of switching said first switch and said second switch and such that said amplifier circuit is removed from said network when power is disabled to said bypass controller circuits, said bypass circuit controller further adapted to send a signal upstream or downstream to change at least one pain level of an upstream or downstream amplifier based on said switching mechanism.

12. The cable telecommunications network of claim 11, wherein said amplifiers within said cascade of amplifiers are spaced less than half the maximum possible distance each said amplifier is capable of traversing to provide effective downstream communications if any single said amplifier is by-passed.

13. The cable telecommunications network of claim 12, wherein said by-passed amplifier is detected by status circuitry within said cable telecommunications network and a by-pass status is communicated to a headend.

14. The cable telecommunications network of claim 12, wherein a location of said by-passed amplifier is detected by location circuitry within said cable telecommunications network said location is communicated to a headend.

15. An amplifier for a distributed gain cable telecommunications network comprising:
    an input line;
    an output line;
    an amplifier circuit;
    a bypass circuit;
    a first switch located between said input line and said amplifier circuit and capable of switching said input line to said amplifier circuit;
    a second switch located between said output line and said amplifier circuit and capable of switching said output line to said amplifier circuit; and
    a bypass circuit controller capable of switching said first switch and said second switch and such that said amplifier circuit is removed from said network, said bypass circuit controller further adapted to receive a signal from another amplifier in said distributed gain cable telecommunications network and adjust the gains of said amplifier circuit such that signals on said input line or said output line are able to bypass said another amplifier.

16. An amplifier for a distributed gain cable telecommunications network comprising:
    an input line;
    an output line;
    an amplifier circuit;
    a bypass circuit;
    a first switch located between said input line and said amplifier circuit and capable of switching said input line to said amplifier circuit;
    a second switch located between said output line and said amplifier circuit and capable of switching said output line to said amplifier circuit; and
    a bypass circuit controller capable of switching said first switch and said second switch and such that said amplifier circuit is removed from said network, said bypass circuit controller further adapted to detect that another amplifier in said distributed gain cable telecommunications network has entered a bypass mode, said bypass circuit controller further adapted to adjust the gains of said amplifier circuit such that signals on said input line or said output line are able to compensate for said another amplifier being in said bypass mode.

* * * * *

UNITED STATES PATENT AND TRADEMARK OFFICE
CERTIFICATE OF CORRECTION

PATENT NO. : 7,126,417 B2 Page 1 of 1
APPLICATION NO. : 10/835944
DATED : October 24, 2006
INVENTOR(S) : Donald M. Bishop It is certified that error appears in the above-identified patent and that said Letters Patent is hereby corrected as shown below:

Column 14, line 2, for the claim 11, "bypass controller circuits" should read --bypass controller circuit--;
Column 14, line 5, for the claim 11, "one pain level" should read --one gain level--.

Signed and Sealed this

Fifteenth Day of April, 2008

JON W. DUDAS
*Director of the United States Patent and Trademark Office*